United States Patent [19]

Hersman

[11] 4,219,745
[45] Aug. 26, 1980

[54] BACKLASH FILTER APPARATUS

[75] Inventor: Michael S. Hersman, Santa Monica, Calif.

[73] Assignee: The United States of America as represented by the Secretary of the Air Force, Washington, D.C.

[21] Appl. No.: 915,709

[22] Filed: Jun. 15, 1978

[51] Int. Cl.² ........................ H03K 5/20; H03K 5/08
[52] U.S. Cl. .................................. 307/358; 328/167; 328/171; 307/237
[58] Field of Search ............ 307/352, 353, 358, 359, 307/237; 328/151

[56] References Cited

U.S. PATENT DOCUMENTS

| | | | |
|---|---|---|---|
| 3,526,786 | 9/1970 | Snyder | 307/352 |
| 3,686,577 | 8/1972 | Fruhauf | 328/151 |
| 3,694,668 | 9/1972 | Foerster | 307/359 |
| 3,708,678 | 1/1973 | Kreda | 307/358 X |
| 3,838,346 | 9/1974 | Cox | 328/151 |

Primary Examiner—John S. Heyman
Attorney, Agent, or Firm—Joseph E. Rusz; William Stepanishen

[57] ABSTRACT

A backlash filter apparatus for the removal of spurious electrical components of a pre-established amplitude level from a voltage signal. The filter apparatus provide a backlash window to which the input signal comprising a desired signal and its spurious noise component is applied. The spurious noise component is removed in the backlash window, thus providing a jitter-free filter output.

6 Claims, 2 Drawing Figures

4,219,745

BACKLASH FILTER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a filter apparatus, and in particular to a backlash filter apparatus for the removal of spurious electrical noise.

In the prior art, electrical filters are well known and find applications in almost all electrical communication and control systems. Radio and television receivers utilize filters to pass a particular selected channel and to reject all other channels. There have been narrow-band band-rejection filters that are used to reduce interference due to spurious electrical noise which may be internally generated by the electronic circuits themselves or external noise signals that have penetrated the unit. One of the more common usages of filter circuits is as a low-pass filter to act as a decoupling network between several amplifier circuits that share the same power supply. In the prior art there has been attempts to utilize conventional low pass filters to eliminate jitter from the output of a bang-bang control system which was being used to position a video camera. Thus, there exists a clear need to eliminate display jitter which was objectionable to operators; however, the use of conventional low pass filtering was found to be unsuitable due to system slew rate requirements. The present invention provides a filter apparatus that eliminates display jitter and compatible with system slew rate requirements.

SUMMARY OF THE INVENTION

The present invention utilizes a variable gain differential amplifier to receive an input signal having spurious electrical noise components of known amplitude. The gain of the differential amplifier is adjusted to provide a backlash window matched to the noise amplitude. The output of the differential amplifier is coupled through a pair of antiparallel diodes to a unity gain voltage follower output differential amplifier. A capacitor at the input of the unity gain amplifier holds the voltage present during the last current flow across the diodes, and a negative feedback path connects the output of the unity gain amplifier to the input of the variable gain amplifier.

It is one object of the present invention, therefore, to provide an improved backlash filter apparatus.

It is another object of the invention to provide an improved filter apparatus wherein the filter will track changes in signal level with error.

It is another object of the invention to provide an improved filter apparatus having a backlash window for the removal of spurious electrical noise of a known applitude.

It is still another object of the invention to provide an improved filter apparatus to eliminate display jitter in a video target acquisition system.

These and other advantages, object and features of the invention will become more apparent from the following description taken in connection with the illustrative embodiment in the accompanying drawings.

DESCRIPTION OF THE PREFERRED EMBODIMENTS

Figure 1:
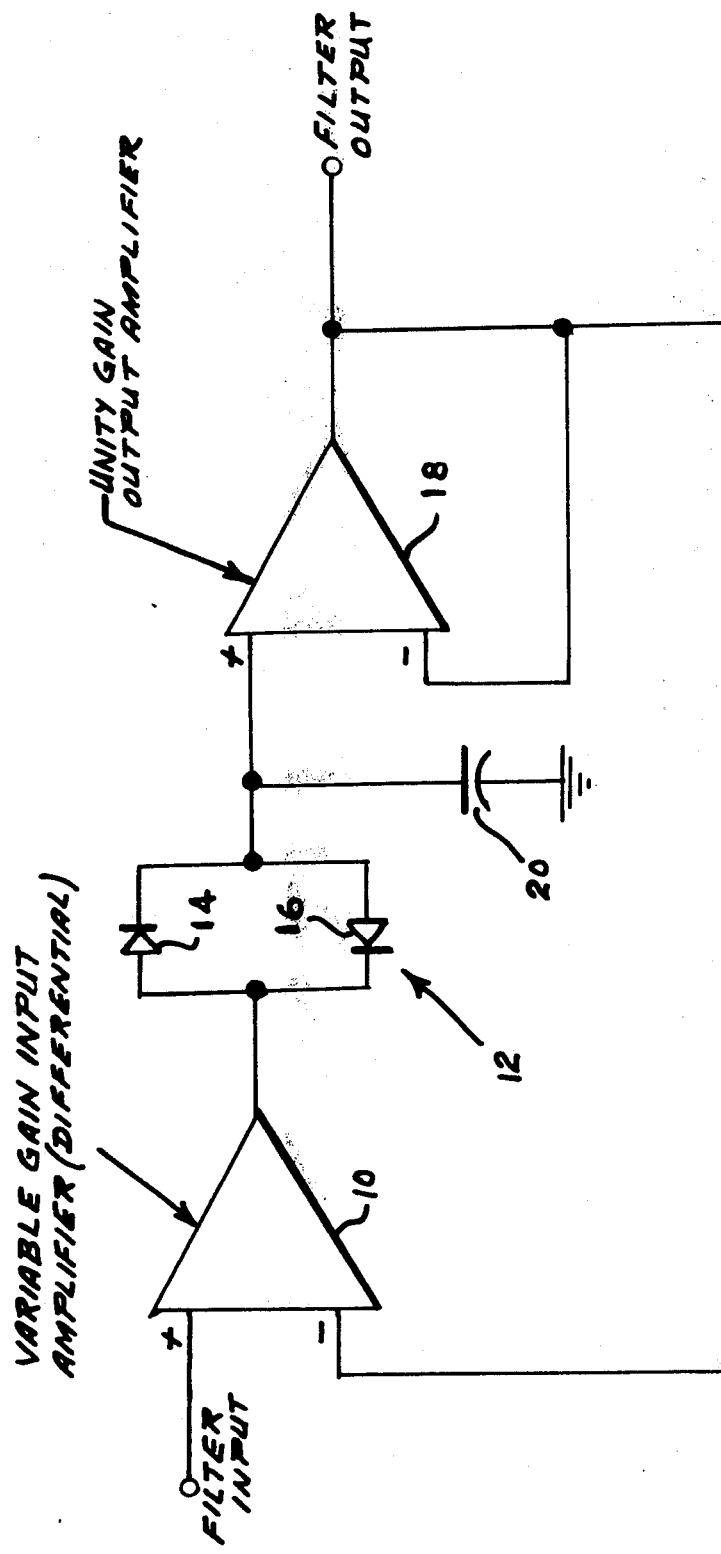
FIG. 1 is a schematic diagram of the backlash filter apparatus in accordance with the present invention, and, FIG. 2 is a graphical representation of a typical input signal to the filter apparatus and typical output signal therefrom.

Referring now to FIG. 1, there is shown a backlash filter apparatus utilizing a differential amplifier 10 to receive the input filter signal at its positive terminal. The gain of the differential amplifier 10 is variable and is varied in accordance with the size of the backlash window that the input signal will be allowed to rattle around in. The size of the backlash window may be varied in accordance with the expected or predetermined spurious noise component of input signal voltage. The output from the differential amplifier 10 is applied to a voltage drop circuit 12 which comprises a pair of diode 14, 16 that are connected to provide a voltage drop regardless to the direction of the applied current flow. The output signal from the voltage drop circuit is applied directly to the positive terminal of the unity gain output amplifier 18. An input capacitor 20 is connected from the positive input terminal of the output amplifier 18 to ground. The input capacitor 20 maintains and holds the last voltage which was present during the last current flow through the diodes, 14, 16. The output amplifier 18 has a feedback path from its output to its negative input terminal to provide a unity gain voltage follower amplifier configuration. An additional feedback circuit is provided from the output of the unity gain output amplifier 18 to the negative input terminal of the differential amplifier 10.

Figure 2:
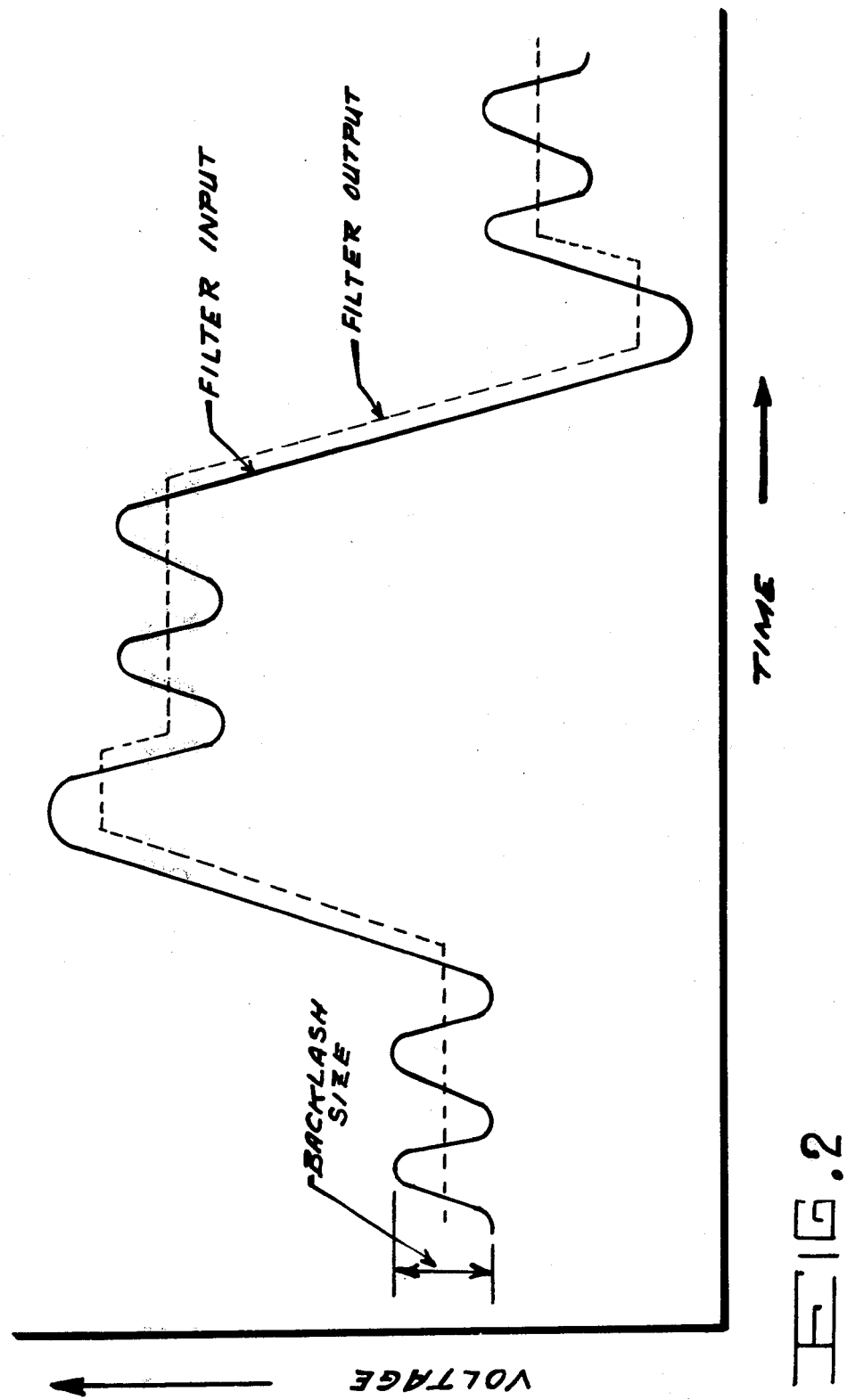

Turning now to FIG. 2, there is shown a typical input signal waveform (designated by the solid line) to the backlash filter apparatus. The output waveform from the backlash filter apparatus is shown by the dashed line. It may be clearly seen that the backlash filter apparatus eliminates the spurious electrical noise components from the input signal while maintaining the system slew rate requirements. The following description of the operation of the backlash filter apparatus will aid in a better understanding of the present invention. In order to analyze circuit operation, assume all initial voltages to be zero, an input gain of 100 for amplifier 10, and a 1 v diode drop in circuit 12. As the input signal rises above 0.01 volts, the output of the input amplifier 10 reaches 1.0 volts and the diodes 14, 16 conduct, thus causing the output to track the input, but lagging by 0.01 volts. For a 5 v output, the input can range between 4.99 and 5.01 volts without changing the output. Should the input rise to 5.50 volts, the output would go to 5.49 v, and now the input could range between 5.48 and 5.50 volts without affecting the output. The size of the backlash window is dependent upon the gain of the input amplifier 10 and the selected diode voltage drop. The size of the backlash window may be calculated as follows:

$$\text{Backlash window} = \frac{2x \text{ (diode drop)}}{\text{input gain}};$$

and should be adjusted to be equal to the p-p noise voltage. This backlash filter apparatus may be made adaptive by the addition of a circuit to measure p-p noise voltage and to adjust input amplifier gain for optimum response.

Although the invention has been described with reference to a particular embodiment, it will be understood to those skilled in the art that the invention is capable of a variety of alternative embodiments within the spirit and scope of the appended claims.

What is claimed is:

1. A gate-free backlash filter aparatus consisting solely of:

a first differential amplifier means having a first and second input terminal, said first differential amplifier means having a variable gain, said variable gain being set to determine the size of a backlash window, said first differential amplifier means receiving an input signal directly at said first input terminal, said input signal including a spurious noise component, said backlash window removing said spurious noise component, said first differential amplifier means continuously operating upon said input signal, said first differential amplifier means having an output terminal, said first differential amplifier means providing an output signal at its output terminal in response to said input signal, a voltage drop means connected to said output terminal of said first differential amplifier means to receive the output signal therefrom, said voltage drop means lowering the voltage of said output signal from said first differential amplifier means by a predetermined amount to provide a voltage signal, said voltage drop means having an output terminal, and;

a second differential amplifier means having a first and second terminal, said second differential amplifier means having a predetermined gain, said second differential amplifier means having an input capacitor connected from said first terminal to ground, said first terminal being connected to said output terminal of said voltage drop means, said input capacitor holding said voltage signal from said voltage drop means, said second differential amplifier means having an output terminal, said output terminal of said second differential amplifier means being directly connected to both said second input terminal of said first differential amplifier means and said second terminal of said second differential amplifier means, said second differential amplifier means receiving said voltage signal from said voltage drop means, said second differential amplifier means amplifying said voltage signal to provide a filter output signal.

2. A backlash filter apparatus as described in claim 1 wherein said backlash window size equals twice the voltage drop of said voltage drop means divided by the gain of said first differential amplifier means.

3. A backlash filter apparatus as described in claim 1 wherein said voltage drop means is sensitive to signal current flow direction.

4. A backlash filter apparatus as described in claim 1 wherein said first terminal of said second differential amplifier means is a positive input terminal and said second terminal of said second differential amplifier means is a negative input terminal.

5. A backlash filter apparatus as described in claim 1 wherein said second differential amplifier means is a voltage follower amplifier with unity gain.

6. A backlash filter apparatus as described in claim 3 wherein said voltage drop means comprises a pair of antiparallel diodes.

* * * * *